(12) United States Patent
Xie et al.

(10) Patent No.: US 12,538,565 B2
(45) Date of Patent: Jan. 27, 2026

(54) SELF-ALIGNED BOTTOM SPACER

(71) Applicant: INTERNATIONAL BUSINESS MACHINES CORPORATION, Armonk, NY (US)

(72) Inventors: Ruilong Xie, Niskayuna, NY (US); Hemanth Jagannathan, Niskayuna, NY (US); Jay William Strane, Warwick, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 691 days.

(21) Appl. No.: 17/810,652

(22) Filed: Jul. 5, 2022

(65) Prior Publication Data
US 2024/0014208 A1    Jan. 11, 2024

(51) Int. Cl.
| | |
|---|---|
| *H10D 84/83* | (2025.01) |
| *H10D 30/01* | (2025.01) |
| *H10D 62/10* | (2025.01) |
| *H10D 64/01* | (2025.01) |
| *H10D 64/27* | (2025.01) |
| *H10D 84/01* | (2025.01) |
| *H10D 84/03* | (2025.01) |
| *H10D 30/63* | (2025.01) |

(52) U.S. Cl.
CPC ............ *H10D 84/83* (2025.01); *H10D 30/025* (2025.01); *H10D 62/116* (2025.01); *H10D 64/015* (2025.01); *H10D 64/018* (2025.01); *H10D 64/517* (2025.01); *H10D 84/0151* (2025.01); *H10D 84/016* (2025.01); *H10D 84/038* (2025.01); *H10D 30/63* (2025.01)

(58) Field of Classification Search
CPC ........... H10D 84/0158; H10D 84/0193; H10D 86/011; H10D 84/834; H10D 84/853; H10D 86/215; H10D 30/62–6219; H10D 30/024–0245; H10D 30/6219; H10D 64/015; H10D 64/018; H10D 64/021; H10D 84/0147; H10D 84/0184; H10D 30/0285; H10D 30/0293; H10D 64/675–679; H10D 68/68–693; H10B 12/36; H10B 12/056; H01L 21/28132–2815
See application file for complete search history.

(56) References Cited

U.S. PATENT DOCUMENTS

| | | | |
|---|---|---|---|
| 9,443,982 B1 * | 9/2016 | Balakrishnan | ......... H10D 30/63 |
| 9,466,690 B1 * | 10/2016 | Balakrishnan | ..... H10D 30/6211 |
| 9,530,698 B1 * | 12/2016 | Basker | ................ H10D 62/834 |
| 9,530,866 B1 * | 12/2016 | Zhang | ................ H10D 30/6735 |

(Continued)

*Primary Examiner* — Maliheh Malek
(74) *Attorney, Agent, or Firm* — Yuanmin Cai

(57) ABSTRACT

Embodiments of present invention provide a method of forming a transistor structure. The method includes forming a set of vertical fins on top of a substrate; forming a conformal spacer lining the set of vertical fins and the substrate; forming sidewall spacers next to vertical portions of the conformal spacer; removing portions of the conformal spacer on top of the substrate and between the sidewall spacers; indenting the conformal spacer vertically between the sidewall spacers and the substrate to create openings; forming bottom spacers in the openings; and forming a shallow-trench-isolation (STI) structure between the bottom spacers. A structure formed thereby is also provided.

13 Claims, 14 Drawing Sheets

(56) References Cited

U.S. PATENT DOCUMENTS

| | | | | |
|---|---|---|---|---|
| 9,536,982 | B1* | 1/2017 | Cheng | H01L 21/31 |
| 9,780,194 | B1* | 10/2017 | Balakrishnan | H10D 30/025 |
| 9,806,078 | B1* | 10/2017 | Xie | H10D 62/151 |
| 9,935,018 | B1* | 4/2018 | Xie | H10D 84/837 |
| 10,014,370 | B1* | 7/2018 | Xie | H10D 64/017 |
| 10,083,871 | B2* | 9/2018 | Cheng | H01L 21/02532 |
| 10,916,638 | B2* | 2/2021 | Cheng | H01L 21/76843 |
| 11,183,583 | B2* | 11/2021 | Mochizuki | H10D 62/151 |
| 11,239,119 | B2* | 2/2022 | Xie | H10D 62/292 |
| 11,757,036 | B2* | 9/2023 | Xie | H10D 30/025 |
| | | | | 257/329 |
| 12,154,985 | B2* | 11/2024 | Xie | H10D 64/252 |
| 12,444,653 | B2* | 10/2025 | Xie | H10D 84/038 |
| 2016/0049339 | A1* | 2/2016 | Li | H01L 21/3065 |
| | | | | 438/154 |
| 2018/0358269 | A1* | 12/2018 | Bao | H10D 84/0142 |
| 2019/0035938 | A1* | 1/2019 | Park | H10D 30/0321 |
| 2019/0115452 | A1* | 4/2019 | Cheng | H10D 30/6728 |
| 2019/0131430 | A1* | 5/2019 | Xie | H01L 21/02181 |
| 2019/0319118 | A1* | 10/2019 | Lee | H10D 30/025 |
| 2019/0355833 | A1* | 11/2019 | Miao | H10D 30/63 |
| 2019/0386135 | A1* | 12/2019 | Li | H10D 84/85 |
| 2021/0296494 | A1* | 9/2021 | Xie | H10D 84/0193 |
| 2023/0031574 | A1* | 2/2023 | Xie | H10D 64/015 |
| 2023/0253317 | A1* | 8/2023 | Tung | H01L 21/32139 |
| | | | | 257/734 |
| 2024/0021609 | A1* | 1/2024 | Xie | H10D 30/025 |
| 2024/0371974 | A1* | 11/2024 | Tsai | H01L 21/02332 |
| 2025/0167076 | A1* | 5/2025 | Xie | H10D 30/6757 |

* cited by examiner

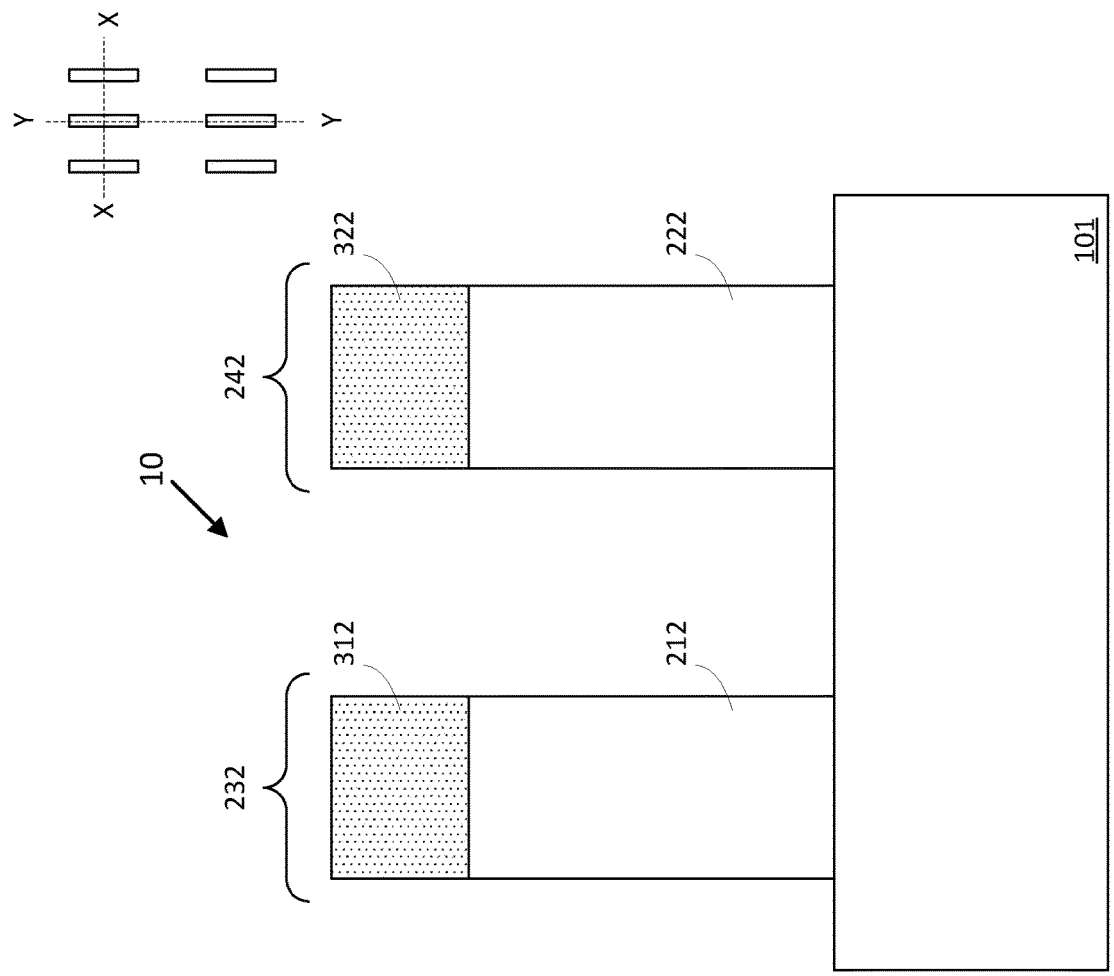
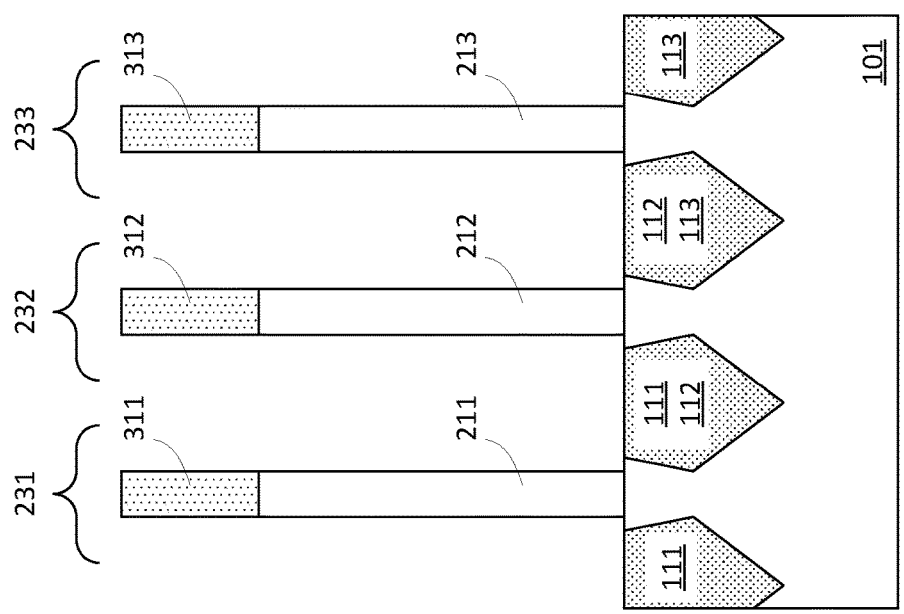
FIG. 1A
FIG. 1B

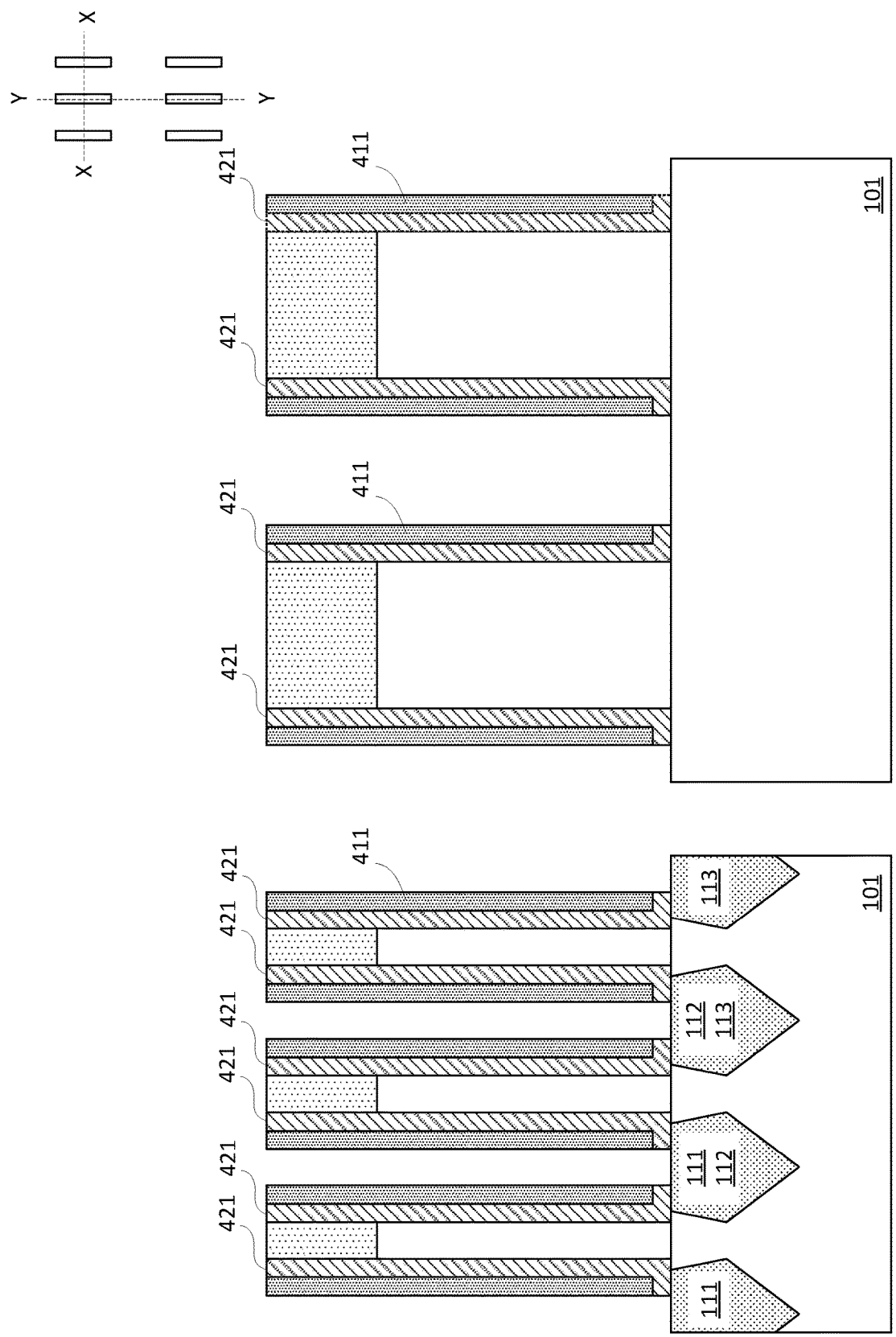

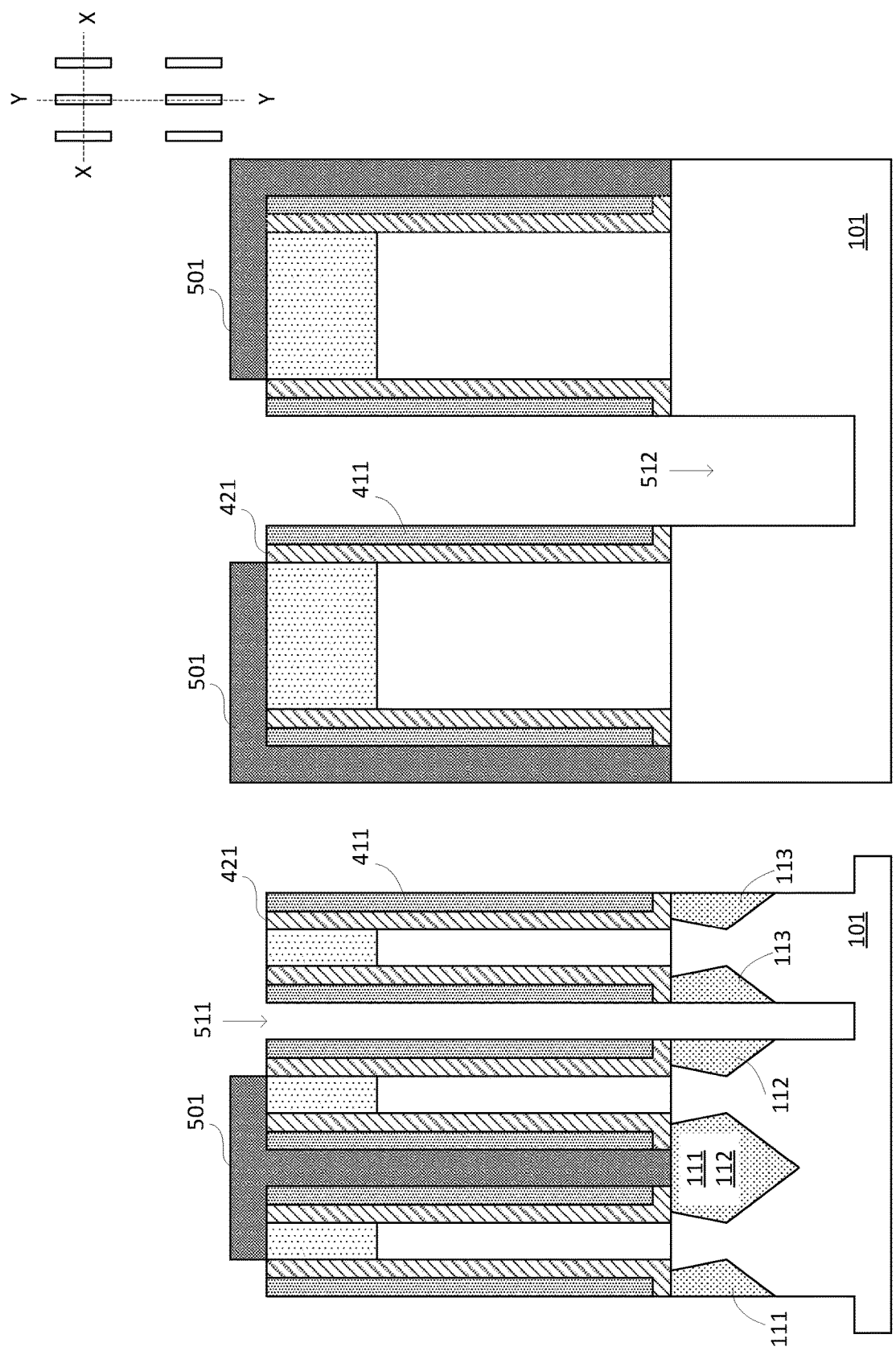

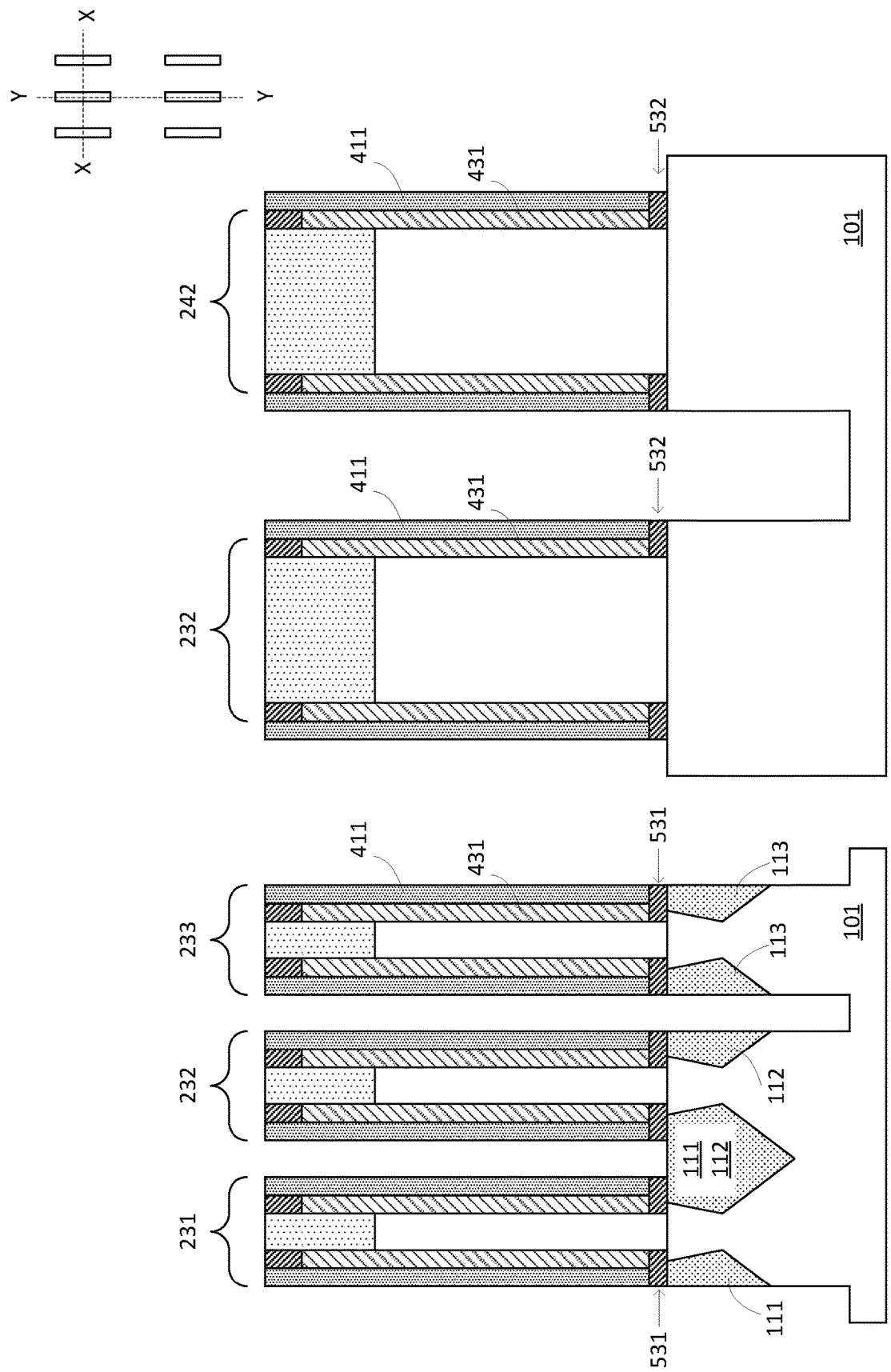

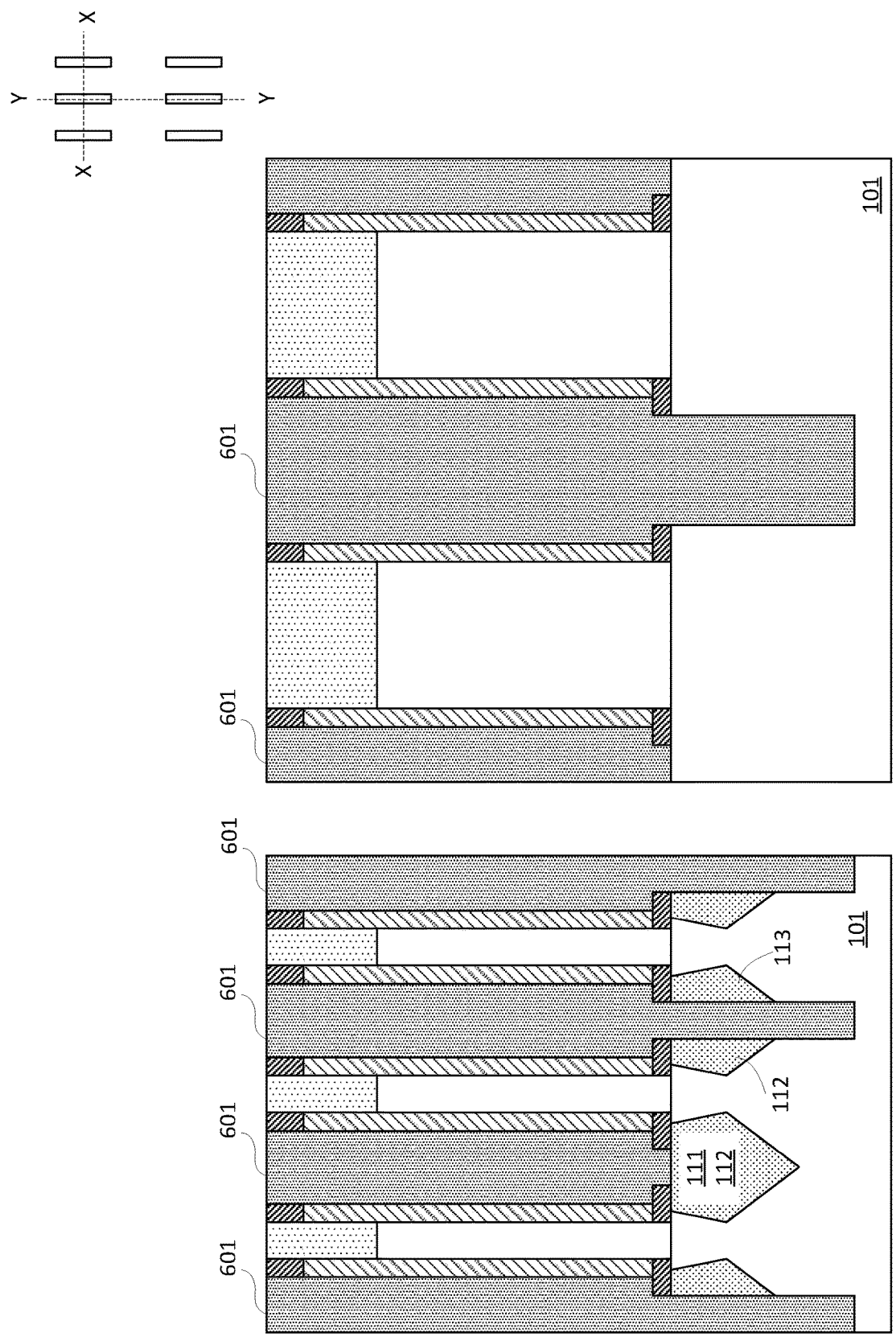

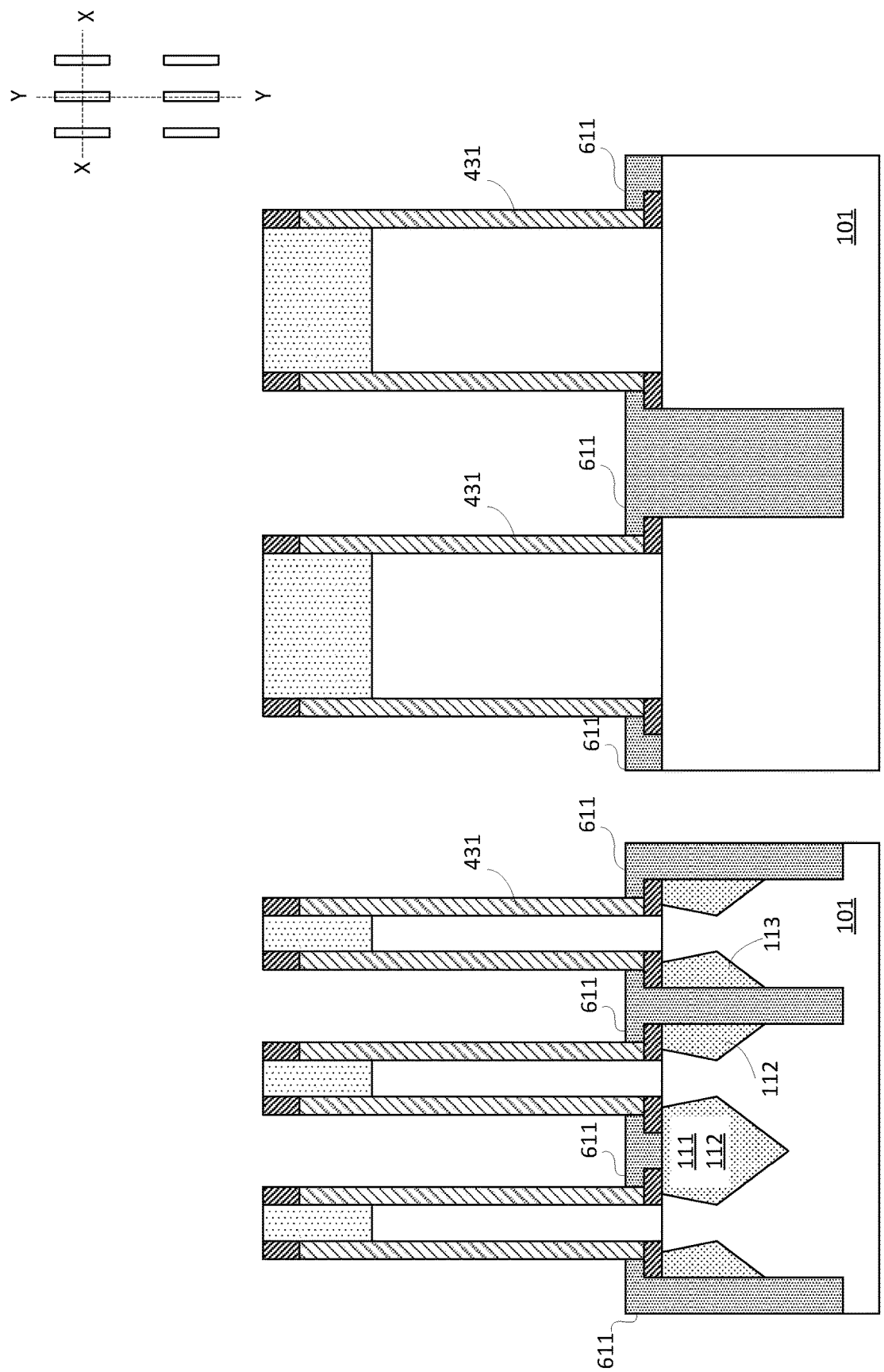

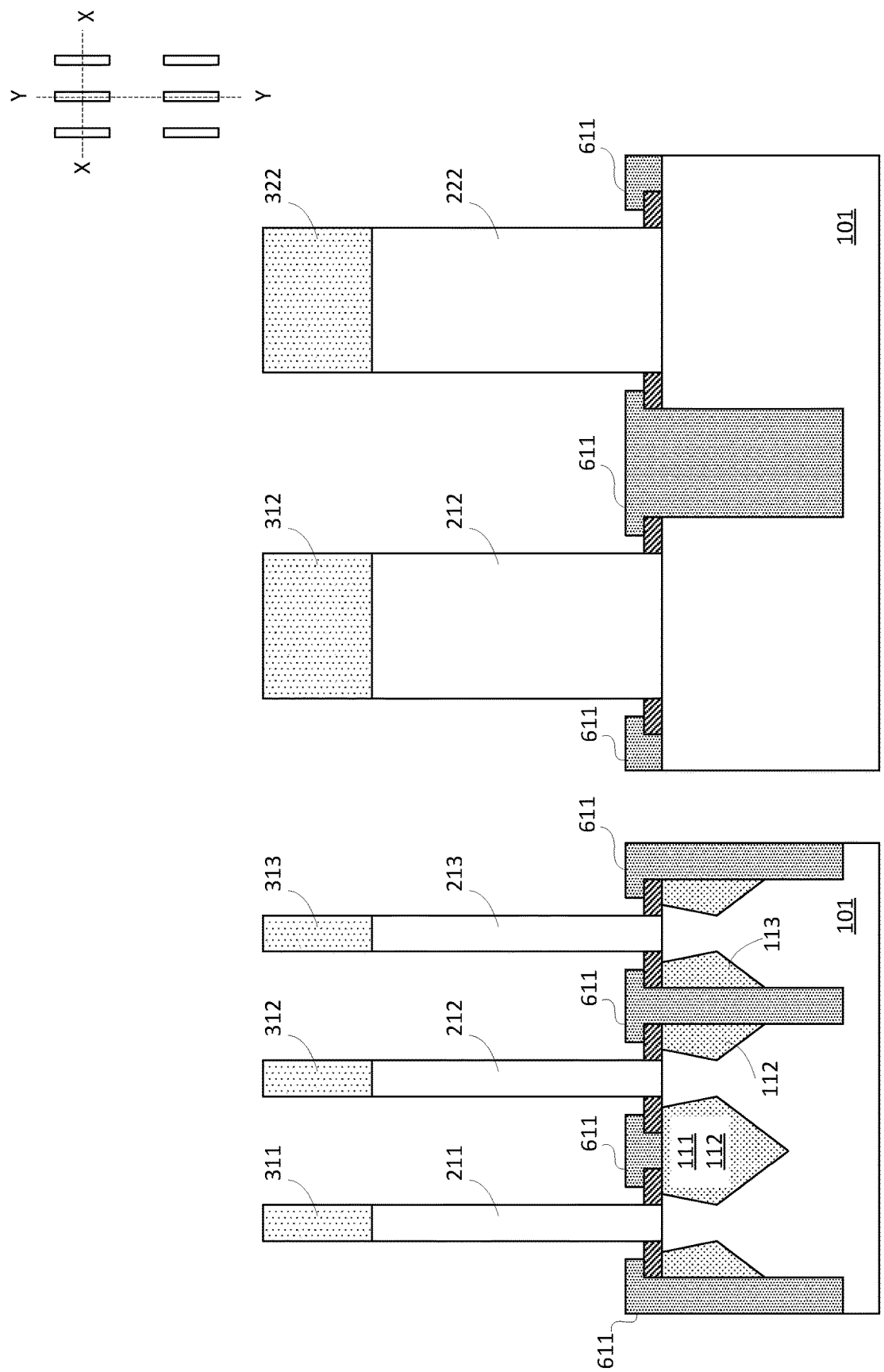

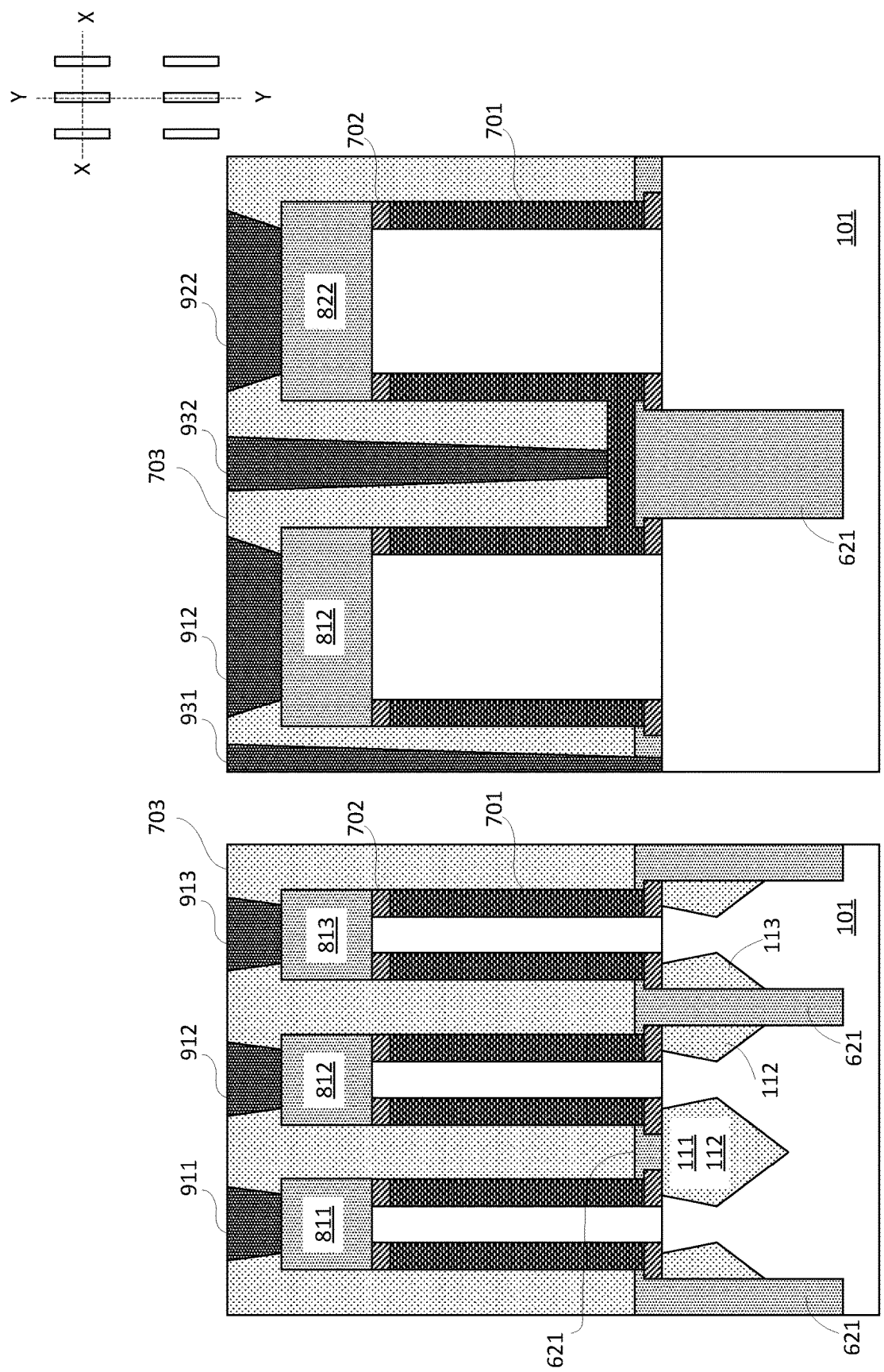

SELF-ALIGNED BOTTOM SPACER

BACKGROUND

The present application relates to manufacturing of semiconductor integrated circuits. More particularly, it relates to method of forming bottom spacers for vertical transistors and structure formed thereby.

As semiconductor industry moves towards smaller node, for example 7-nm node and beyond, field-effect-transistors (FETs) are aggressively scaled in order to fit into the reduced footprint or real estate, as defined by the node, with increased device density. Among various types of FETs, non-planar FETs such as fin-type FETs and in particular vertical fin-type FETs have been shown to have the potential to meet this continued device scaling needs.

In a vertical transistor such as a vertical fin-type FET, electric current flows in a vertical direction from a bottom source/drain (S/D) region to a top S/D region, or from the top S/D region to the bottom S/D region. The gate of the vertical transistor, formed from a portion of a vertical fin, is separated from the bottom S/D region by a bottom spacer and from the top S/D region from a top spacer. Performance of the vertical transistor is greatly influenced by the top and bottom spacers between the S/D regions and the gate. However, in the current vertical transistors, bottom spacers manufactured by the currently existing art have been observed to exhibit device-layout and/or other feature related variations which are undesirable from performance standpoint of the vertical transistors. For example, using currently existing manufacturing process, vertical transistors that are adjacent to each other closely may be manufactured to have bottom spacers that are thinner than bottom spacers of those vertical transistors that are more, relatively, widely separated to each other due to loading effect.

SUMMARY

Embodiments of present invention provide a transistor structure. The transistor structure includes a first vertical transistor having a first fin surrounded by a first gate stack, a first bottom spacer between a first bottom source/drain (S/D) region and the first gate stack, wherein the first bottom spacer has a horizontal width that is larger than a horizontal width of the first gate stack, and a shallow-trench-isolation (STI) structure covers a horizontal portion of the first bottom spacer that is not covered by the first gate stack.

In a further embodiment, the transistor structure further includes a second vertical transistor adjacent to the first vertical transistor, the second vertical transistor having a second fin surrounded by a second gate stack, a second bottom spacer between a second bottom S/D region and the second gate stack, wherein the second bottom spacer has a horizontal width that is larger than a horizontal width of the second gate stack, and the STI structure covers a horizontal portion of the second bottom spacer that is not covered by the second gate stack.

In one embodiment, the STI structure has a T-shape with a first horizontal portion of the T-shape over the horizontal portion of the first bottom spacer of the first vertical transistor and a second horizontal portion of the T-shape over the horizontal portion of the second bottom spacer of the second vertical transistor. In one aspect, the STI structure isolates the first bottom S/D region of the first vertical transistor from the second bottom S/D region of the second vertical transistor. In another aspect, the first bottom S/D region of the first vertical transistor and the second bottom S/D region of the second vertical transistor share a common bottom S/D region underneath the STI structure.

Embodiments of present invention also provide a method of forming a transistor structure. The method includes forming a set of vertical fins on top of a substrate; forming a conformal spacer lining the set of vertical fins and the substrate; forming sidewall spacers next to vertical portions of the conformal spacer; removing portions of the conformal spacer that are on top of the substrate and between the sidewall spacers; indenting the conformal spacer vertically between the sidewall spacers and the substrate to create openings; forming bottom spacers in the openings; and forming a shallow-trench-isolation (STI) structure between the bottom spacers.

In one embodiment, indenting the conformal spacer includes performing an isotropic selective etching process to remove portions of the conformal spacer between the sidewall spacers and the substrate to expose a bottom portion of the set of vertical fins.

In another embodiment, forming bottom spacers includes forming a conformal liner lining the openings and the sidewall spacers, wherein the conformal liner pinches off inside the openings, and subsequently removing the conformal liner on the sidewall spacers through an isotropic etching process.

According to one embodiment, the method further includes, before forming the STI structure, removing the sidewall spacers to expose horizontal portions of the bottom spacers. According to yet another embodiment, forming the STI structure includes forming the STI structure with a T-shape with horizontal portions of the T-shape covering the horizontal portions of the bottom spacers.

In one embodiment, removing portions of the conformal spacer on top of the substrate further includes removing a portion of an epitaxial source/drain region underneath the conformal spacer.

BRIEF DESCRIPTION OF THE DRAWINGS

The present invention will be understood and appreciated more fully from the following detailed description of embodiments of present invention, taken in conjunction with accompanying drawings of which:

FIGS. 1A and 1B are demonstrative illustrations of cross-sectional views of a vertical transistor structure in a step of manufacturing thereof according to one embodiment of present invention;

FIGS. 4A and 4B are demonstrative illustrations of cross-sectional views of a vertical transistor structure in a step of manufacturing thereof, following the step illustrated in FIGS. 3A and 3B, according to one embodiment of present invention;

FIGS. 5A and 5B are demonstrative illustrations of cross-sectional views of a vertical transistor structure in a step of manufacturing thereof, following the step illustrated in FIGS. 4A and 4B, according to one embodiment of present invention;

FIGS. 8A and 8B are demonstrative illustrations of cross-sectional views of a vertical transistor structure in a step of manufacturing thereof, following the step illustrated in FIGS. 7A and 7B, according to one embodiment of present invention;

FIGS. 9A and 9B are demonstrative illustrations of cross-sectional views of a vertical transistor structure in a step of manufacturing thereof, following the step illustrated in FIGS. 8A and 8B, according to one embodiment of present invention;

FIGS. 10A and 10B are demonstrative illustrations of cross-sectional views of a vertical transistor structure in a step of manufacturing thereof, following the step illustrated in FIGS. 9A and 9B, according to one embodiment of present invention;

FIGS. 11A and 11B are demonstrative illustrations of cross-sectional views of a vertical transistor structure in a step of manufacturing thereof, following the step illustrated in FIGS. 10A and 10B, according to one embodiment of present invention;

FIGS. 13A and 13B are demonstrative illustrations of cross-sectional views of a vertical transistor structure in a step of manufacturing thereof, following the step illustrated in FIGS. 12A and 12B, according to one embodiment of present invention.

Figures 2A, 2B:
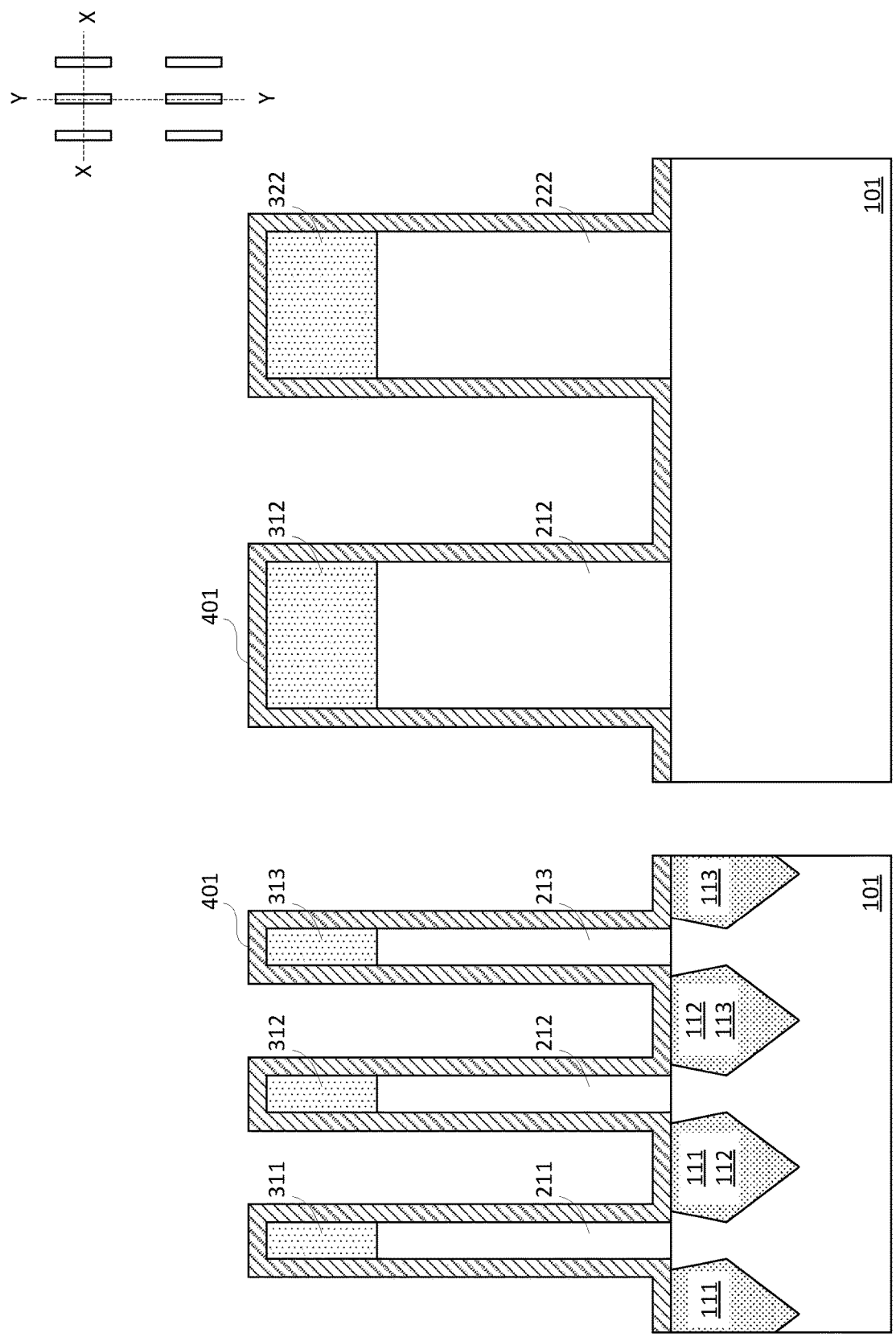
FIGS. 2A and 2B are demonstrative illustrations of cross-sectional views of a vertical transistor structure in a step of manufacturing thereof, following the step illustrated in FIGS. 1A and 1B, according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A and 1B are demonstrative illustrations of cross-sectional views of a vertical transistor structure 10 in a step of manufacturing thereof according to one embodiment of present invention. More specifically, with reference to a simplified top view of the vertical transistor structure 10 shown at the upper-right corner, FIG. 1A illustrates a cross-sectional view of the structure along the X-X dashed line and FIG. 1B illustrates a cross-sectional view of the structure along the Y-Y dashed line.

The vertical transistor structure 10 may include, for example, a substrate 101. The substrate 101 may be a silicon (Si) substrate, a germanium (Ge) substrate, a silicon-germanium (SiGe) compound substrate, a silicon-on-insulator (SOI) substrate, or any other suitable substrate. A plurality of fin-type semiconductor structures such as a first fin 211, a second fin 212, a third fin 213, a fourth fin 222 and other fins may be formed on top of the substrate 101. Although the first, second, and third fins 211, 212, and 213 may be demonstratively illustrated in FIG. 1A as being equally spaced, embodiments of present invention are not limited in this aspect. The first, second, and third fins 211, 212, and 213 may be unequally spaced as well. FIG. 1A demonstratively illustrates sidewalls of the first, second, and third fins 211, 212, and 213. In one embodiment, a gap between the two opposing sidewalls of the second fin 212 and the third fin 213 may be wider than a gap between the two opposing sidewalls of the first fin 211 and the second fin 212. In one embodiment, the gap between the two opposing sidewalls of the second fin 212 and the third fin 213 may be, for example, twice as wide as the gap between the two opposing sidewalls of the first fin 211 and the second fin 212. Similarly, as being demonstratively illustrated in FIG. 1B, a gap between two opposing ends of the second fin 212 and the fourth fin 222 may be wider than, and in one embodiment may be twice as wide as, the gap between the two opposing sidewalls of the second fin 212 and the third fin 213.

The plurality of fins may be formed through a reactive-ion-etching (RIE) process with hard masks formed on top thereof such as hard masks 311, 312, 313, and 322. The hard masks 311, 312, 313, and 322 remain on top of the first, second, third and fourth fins 211, 212, 213, and 222. Additionally, a plurality of epitaxial source/drain (S/D) regions such as S/D regions 111, 112, 113 may be formed inside the substrate 101, adjacent to their corresponding fins such as the first, second, and third fins 211, 212, and 213 respectively. In one embodiment, the S/D region 111/112 between the first and second fins 211 and 212 may be a common S/D region shared by the first fin 211 of a first vertical transistor 231 and the second fin 212 of a second vertical transistor 232. Similarly, the S/D region 112/113 between the second and third fins 212 and 213 may be a common S/D region (before it is separated into two individual S/D regions as being described below in more details) shared by the second fin 212 of the second vertical transistor 232 and the third fin 213 of a third vertical transistor 233. The fourth fin 222 is made for a fourth vertical transistor 242.

FIGS. 2A and 2B are demonstrative illustrations of cross-sectional views of a vertical transistor structure in a step of manufacturing thereof, following the step illustrated in FIGS. 1A and 1B, according to one embodiment of present invention. More specifically, embodiments of present invention provide forming a conformal spacer 401 lining at least sidewalls and ends of the fins, such as the first, second, third, and fourth fins 211, 212, 213, and 222, and other exposed surfaces of the substrate 101 and S/D regions between the fins such as S/D regions 111, 112 and 113. The conformal spacer 401 may be made of titanium-oxide (TiOx) or any other suitable materials and may be deposited using an atomic-level-deposition (ALD) process.

Figure 3B:
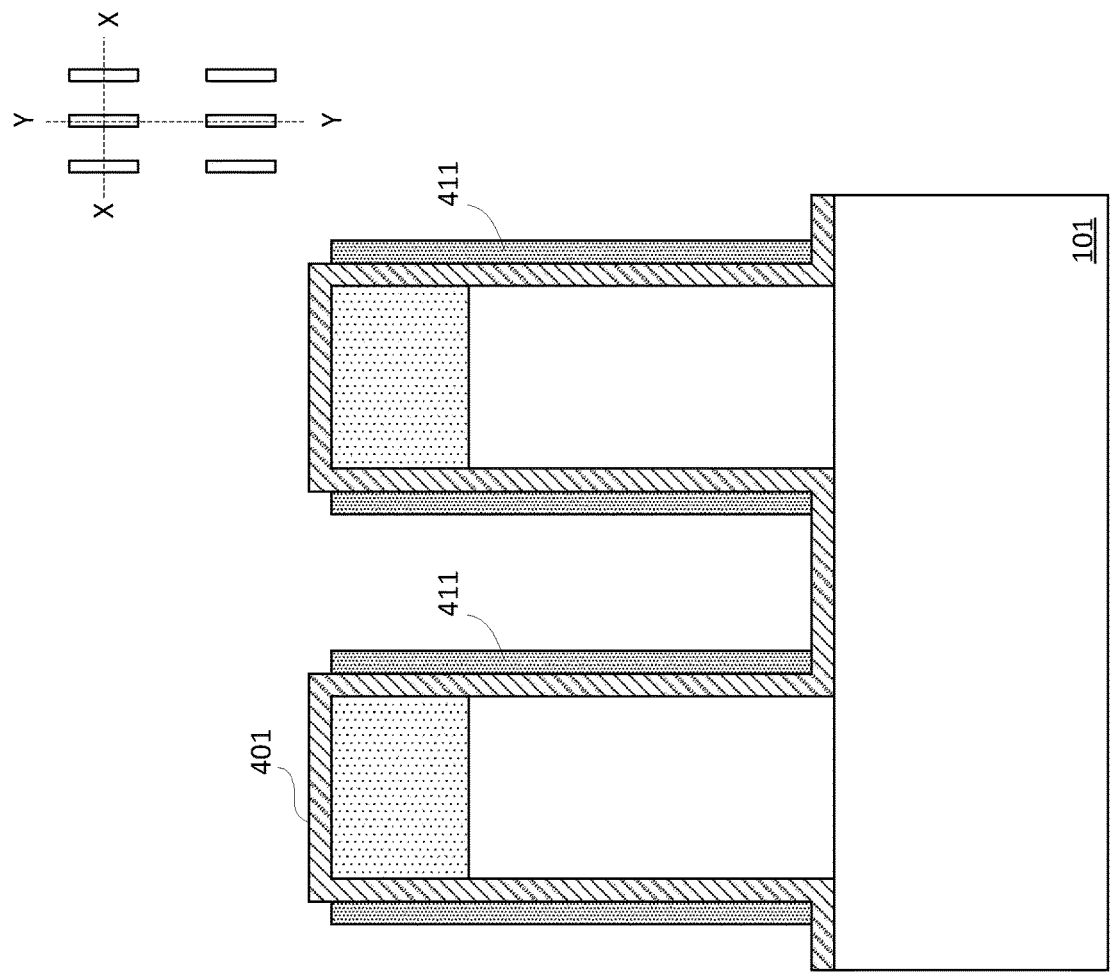
FIGS. 3A and 3B are demonstrative illustrations of cross-sectional views of a vertical transistor structure in a step of manufacturing thereof, following the step illustrated in FIGS. 2A and 2B, according to one embodiment of present invention.
Figure 3A:
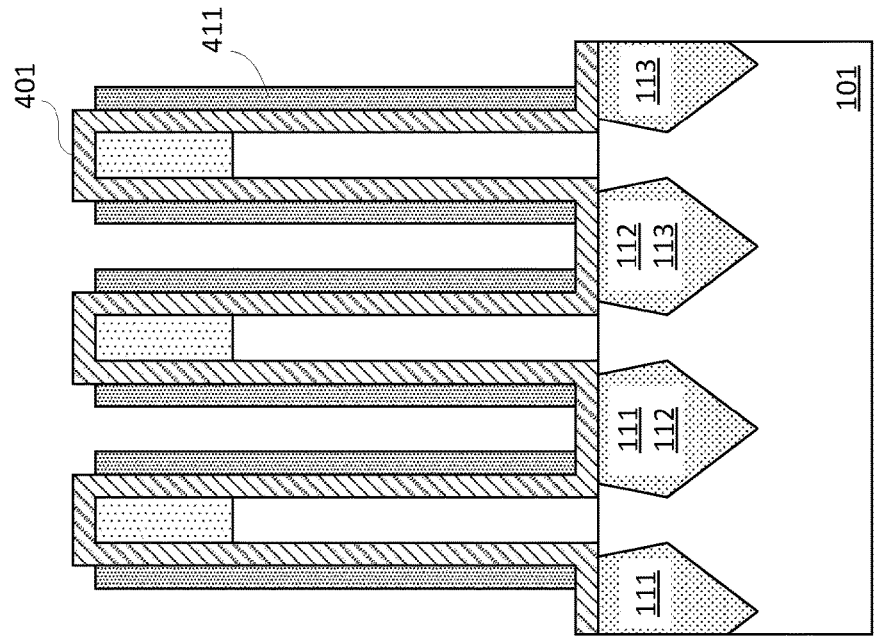

FIGS. 3A and 3B are demonstrative illustrations of cross-sectional views of a vertical transistor structure in a step of manufacturing thereof, following the step illustrated in FIGS. 2A and 2B, according to one embodiment of present invention. More specifically, embodiments of present invention provide forming sidewall spacers 411 next to the vertical portions of the conformal spacer 401. The sidewall spacers 411 may be made of, for example, oxide although other types of suitable materials such as nitride may be used as well. The sidewall spacers 411 may be formed through first depositing a layer of oxide material on top of the conformal spacer 401 and subsequently applying a selective anisotropic etching process. This anisotropic etching process may selectively remove portions of this oxide material layer that are horizontally on top of the conformal spacer 401, leaving the vertical portions thereof to form sidewall spacers 411 next to the vertical portions of the conformal spacer 401.

FIGS. 4A and 4B are demonstrative illustrations of cross-sectional views of a vertical transistor structure in a step of manufacturing thereof, following the step illustrated in FIGS. 3A and 3B, according to one embodiment of present invention. More specifically, embodiments of present invention provide performing a selective etching process, using the sidewall spacers 411 as mask, to remove portions of the conformal spacer 401 that are on top of the S/D regions 111, 112, and 113 between the first, second, and third fins 211, 212, and 213. This selective etching process also removes conformal spacer 401 on top of the substrate 101 between the opposing ends of the second fin 212 and the fourth fin 222 as being demonstratively illustrated in FIG. 4B. Portions of the conformal spacer 401 that are on top of the hard masks, such as the hard masks 311, 312, 314 and 322, may also be removed. The removal of above portions of the conformal spacer 401 transforms the conformal spacer 401 into conformal spacers 421, which are modified from the conformal spacer 401.

FIGS. 5A and 5B are demonstrative illustrations of cross-sectional views of a vertical transistor structure in a step of manufacturing thereof, following the step illustrated in FIGS. 4A and 4B, according to one embodiment of present invention. More specifically, embodiments of present invention provide forming a mask 501 to cover some S/D regions such as, for example, the S/D region 111/112 between the first fin 211 and the second fin 212 and leave, for example, the S/D region 112/113 and the area between the second fin 212 and the fourth fin 222 being exposed for additional processing. Mask 501 may be an organic planarization layer (OPL) and may be patterned using, for example, any known lithographic patterning process.

After forming mask 501, embodiments of present invention provide performing a self-aligned source/drain (S/D) patterning process. More specifically, the S/D patterning process creates an opening 511 into the substrate 101, for example, that separates the common S/D region 112/113 inside substrate 101 into two separate S/D regions such as the second S/D region 112 of the second vertical transistor 232 that includes the second fin 212, and the third S/D region 113 of the third vertical transistor 233 that includes the third fin 213. Further for example, the S/D patterning process also creates an opening 512 into the substrate 101 between the two opposing ends of the second fin 212 of the second vertical transistor 232 and the fourth fin 222 of the fourth vertical transistor 242. The S/D patterning process may be an anisotropic etching process, selective to sidewall spacers 411 and conformal spacers 421, and the etching process thereby is self-aligned to sidewall spacers 411.

Figures 6A, 6B:
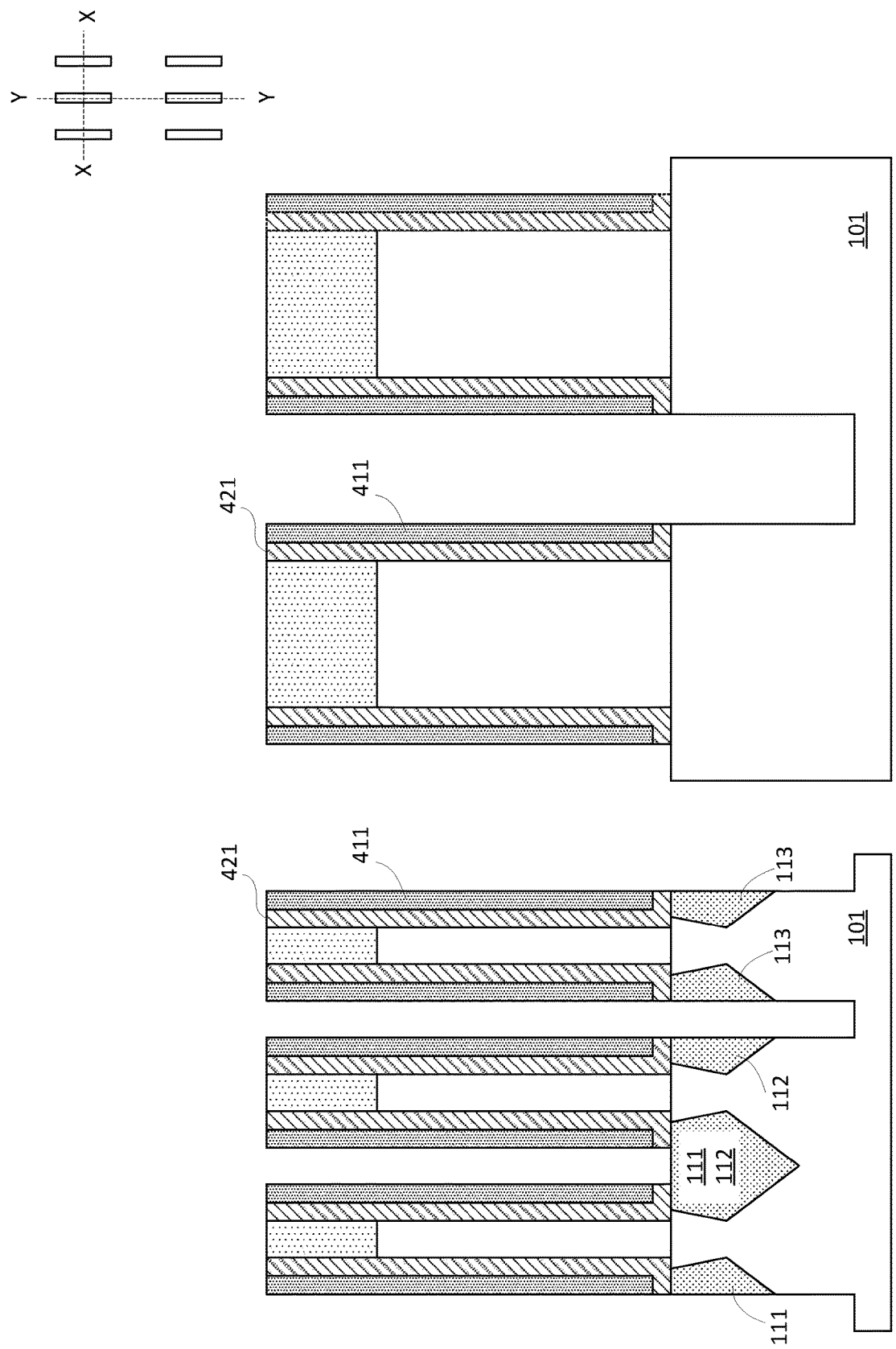
FIGS. 6A and 6B are demonstrative illustrations of cross-sectional views of a vertical transistor structure in a step of manufacturing thereof, following the step illustrated in FIGS. 5A and 5B, according to one embodiment of present invention.

FIGS. 6A and 6B are demonstrative illustrations of cross-sectional views of a vertical transistor structure in a step of manufacturing thereof, following the step illustrated in FIGS. 5A and 5B, according to one embodiment of present invention. More specifically, embodiments of present invention provide removing the mask 501 after performing the S/D patterning process to expose the sidewall spacers 411, conformal spacers 421, and S/D regions such as the common S/D region 111/112 that were previously protected by the mask 501. For example, embodiments of present invention provide removing the mask 501 by stripping off the mask material of OPL within the gaps between sidewall spacers 411 of neighboring fins, as well as the mask material of OP on top of the hard masks such as hard masks 311, 312, 313 and 322.

Figures 7A, 7B:
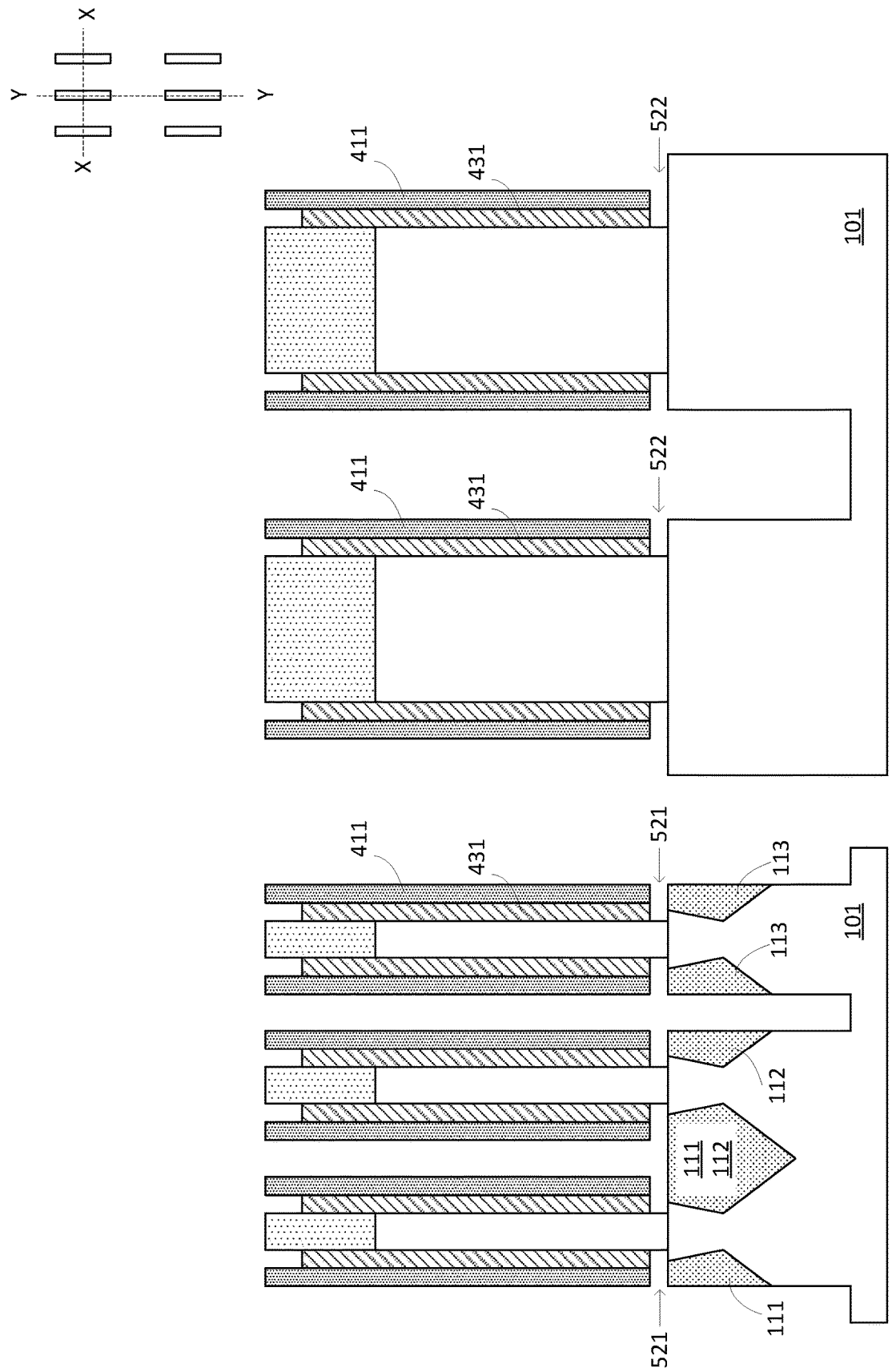
FIGS. 7A and 7B are demonstrative illustrations of cross-sectional views of a vertical transistor structure in a step of manufacturing thereof, following the step illustrated in FIGS. 6A and 6B, according to one embodiment of present invention.

FIGS. 7A and 7B are demonstrative illustrations of cross-sectional views of a vertical transistor structure in a step of manufacturing thereof, following the step illustrated in FIGS. 6A and 6B, according to one embodiment of present invention. More specifically, embodiments of present invention provide performing indentation of the conformal spacers 421 through the openings between sidewall spacers 411 and the substrate 101. For example, the indentation may be performed through an isotropic etching process, selective to sidewall spacers 411 and the fins 211, 212, 213, and 222 for example, and may remove portions of the conformal spacers 421 until portions of the fins 211, 212, 213, and 222 covered by these conformal spacers 421 are exposed. The indentation thus transforms the conformal spacers 421 into conformal spacers 431; creates openings 521 at the sidewalls of the fins 211, 212, 213, and 222 underneath conformal spacers 431 and sidewall spacers 411; and creates opening 522 at the ends of the fins 211, 212, 213, and 222 underneath conformal spacers 431 and sidewall spacers 411 as well. Indentation may also be created, at the other end of conformal spacers 421, between sidewall spacers 411 and the hard masks 311, 312, 313, and 322.

FIGS. 8A and 8B are demonstrative illustrations of cross-sectional views of a vertical transistor structure in a step of manufacturing thereof, following the step illustrated in FIGS. 7A and 7B, according to one embodiment of present invention. More specifically, embodiments of present invention provide forming bottom spacers 531 and 532 of the vertical transistors at the sidewalls and ends of their respective fins such as the first, second, third, and fourth fins 211, 212, 213, and 222.

Bottom spacers 531 and 532 may be silicon-nitride (SiN) or any other suitable materials, and may be formed through, for example, an ALD process. More particularly, a conformal liner such as, for example, a SiN layer may be deposited to line openings 521 and 522 through the ALD process. When the conformal liner is deposited to a thickness of about a half of the vertical height of the openings 521 and/or 522, the conformal liner may pinch-off inside the openings 521 and 522. Subsequently, an isotropic etch-back process may be performed to remove any of the conformal liner at the sidewall spacers 411 and inside openings 511 and 512 in the substrate 101. The portions of the conformal liner inside the openings 521 and 522 may not be impacted by the isotropic etching and may be left there to form bottom spacers 531 and 532.

Bottom spacers 531 and 532 are formed by filling the openings 521 and 522 which are in-turn created through the removal of conformal spacers 421. Therefore, bottom spacers 531 and 532 inherently have the same vertical thickness and same vertical thickness among the bottom spacers 531 themselves or among the bottom spacers 532 themselves. For example, bottom spacers 531 of the third vertical transistor 233 may have the same vertical thickness as bottom spacers 531 of the first vertical transistor 231 regardless the gap between the second and third fins 212 and 213 of the second and third vertical transistors 232 and 233 may be twice as wide as the gap between the first and second fins 211 and 212 of the first and second vertical transistors 231 and 232. Further for example, bottom spacers surrounding the fins, such as the second fin 212, may have a substantially uniform vertical thickness around the fins, both at sidewalls such as bottom spacer 531 and at ends such as bottom spacer 532. Vertical thickness of the bottom spacers does not suffer from device layout and/or pattern related variations, as opposed to what has been observed in the prior art.

After forming bottom spacers 531 and 532, sidewall spacers 411 may be optionally removed through a selective etching process before forming shallow trench isolation (STI) regions inside openings 511 and 512 and/or between the fins. Alternatively, sidewall spacers 411 may remain next to sidewalls of conformal spacers 431 and some of which may become part of the STI regions later as being described below in more details.

FIGS. 9A and 9B are demonstrative illustrations of cross-sectional views of a vertical transistor structure in a step of manufacturing thereof, following the step illustrated in FIGS. 8A and 8B, according to one embodiment of present invention. More specifically, embodiments of present invention provide filling the gaps between the fins and the openings 511 and 512 in the substrate 101 with insulating material such as, for example, flowable oxide to form insulating structure 601. In one embodiment, the insulating structure 601 may also include the sidewall spacers 411, should the sidewall spacers 411 were not removed in a previous step. A chemical-mechanic-polishing (CMP) process may subsequently be applied to planarize a top surface of the insulating structure 601 such that it becomes planar with top surfaces of the hard masks such as the hard masks 311, 312, 313, and 322. In one embodiment, the insulating structure 601 isolates the bottom S/D region 112 of the second vertical transistor 232 from the bottom S/D region 113 of the third vertical transistor 233. In another embodiment, the insulating structure 601 situates directly on top of a common bottom S/D region such as the common bottom S/D region 111/112 between the first vertical transistor 231 and the second vertical transistor 232.

FIGS. 10A and 10B are demonstrative illustrations of cross-sectional views of a vertical transistor structure in a step of manufacturing thereof, following the step illustrated in FIGS. 9A and 9B, according to one embodiment of present invention. More specifically, embodiments of present invention provide recessing the insulating structures 601 such that sidewall surfaces of the majority of the conformal spacers 431 may be exposed. The recessing of insulating structures 601 creates STI structures 611 that have a T-shape. The horizontal portions of the T-shape STI structures 611 sit on top of and cover horizontal portions of bottom spacers 531 and 532. In other words, horizontal portions of the bottom spacers 531 and 532 that are not covered by the conformal spacers 431 are underneath the horizontal portions of the T-shape STI structure 611. For example, a first horizontal portion of the T-shape is over a horizontal portion of the bottom spacer 531 of the first vertical transistor 231 and a second horizontal portion of the T-shape is over a horizontal portion of the bottom spacer 531 of the second vertical transistor 232.

FIGS. 11A and 11B are demonstrative illustrations of cross-sectional views of a vertical transistor structure in a step of manufacturing thereof, following the step illustrated in FIGS. 10A and 10B, according to one embodiment of present invention. More specifically, embodiments of present invention provide removing the conformal spacers 431 that cover, on their sides, sidewalls and ends of the fins such as the first, second, third, and fourth fins 211, 212, 213, and 222 and cover, on their bottoms, portions of the bottom spacers 531 and 532. The conformal spacers 431, which may be made of TiOx, may be removed through a selective etching process.

Figure 12A:
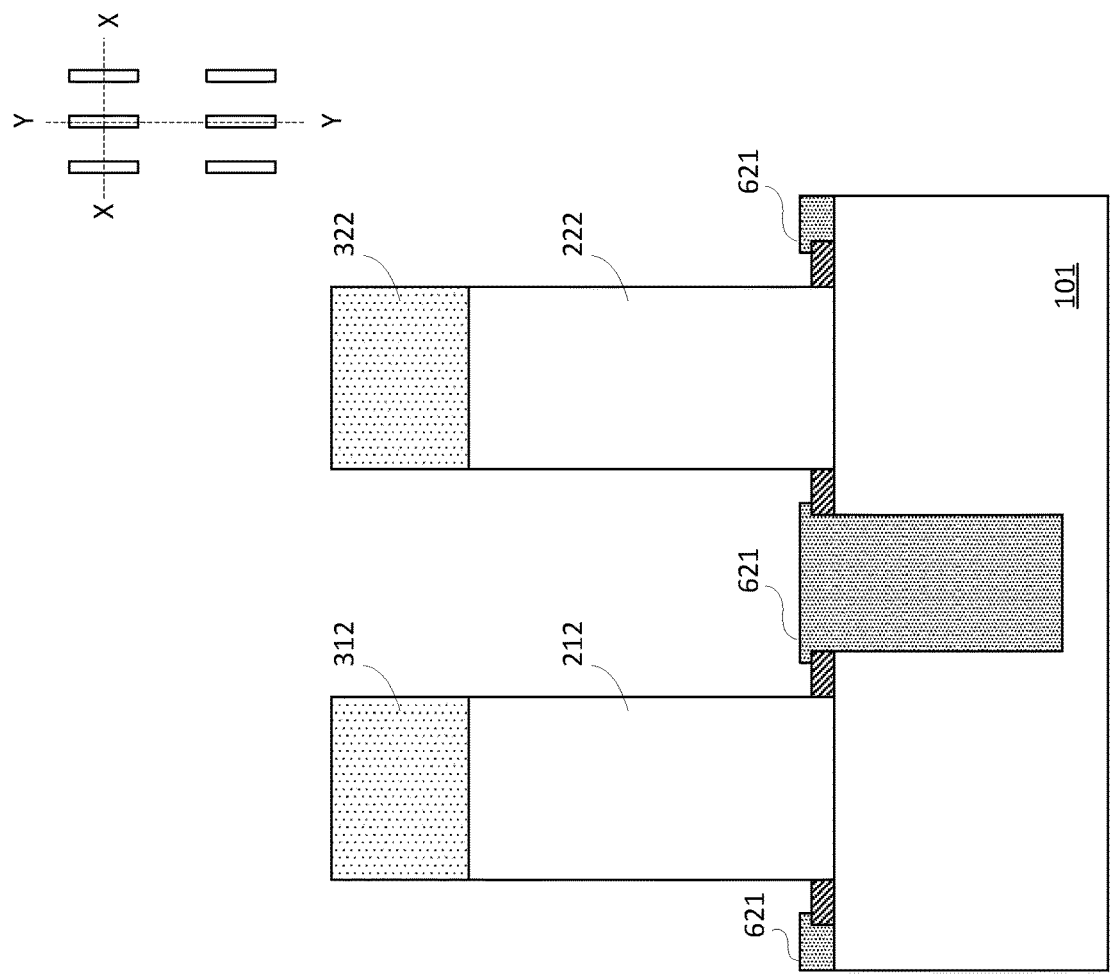
FIGS. 12A and 12B are demonstrative illustrations of cross-sectional views of a vertical transistor structure in a step of manufacturing thereof, following the step illustrated in FIGS. 11A and 11B, according to one embodiment of present invention.
Figure 12B:
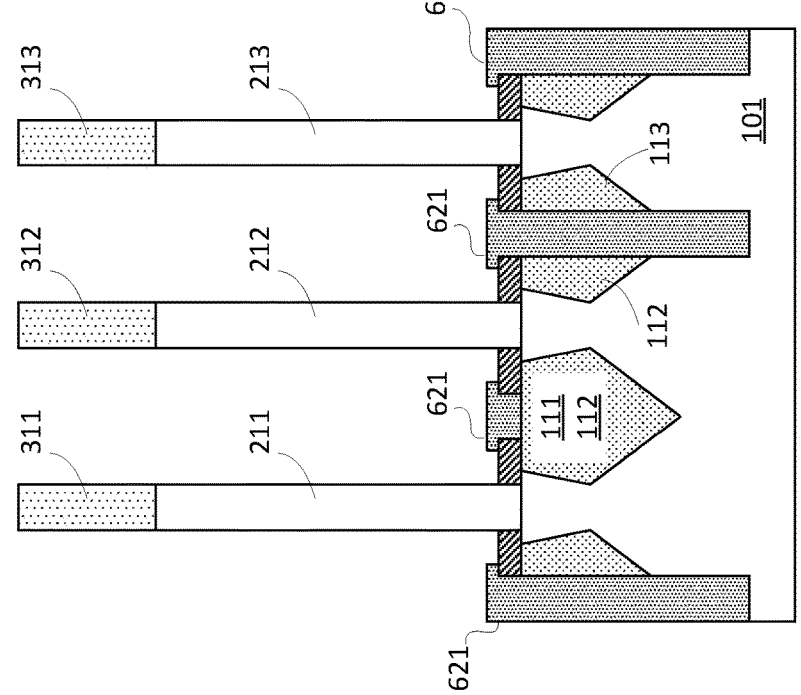

FIGS. 12A and 12B are demonstrative illustrations of cross-sectional views of a vertical transistor structure in a step of manufacturing thereof, following the step illustrated in FIGS. 11A and 11B, according to one embodiment of present invention. More specifically, embodiments of present invention provide, before forming the rest structures of the vertical transistors, performing a pre-cleaning of the fins to remove any residual elements such as, for example, native $SiO_2$. The pre-cleaning may be performed using dilute HF wet solution (DHF). The pre-cleaning process may slightly shrink the STI structures 611 to become STI structures 621 which maintain the T-shape. Here it is to be noted that in one embodiment the T-shape STI structure 621 may have its vertical portion deep into the substrate 101 as the STI structure 621 between S/D regions 112 and 113. In another embodiment, the vertical portion of the STI structure 621 may be sitting on top of a common S/D region such as the common S/D region 111/112 in between the first and second fins 211 and 212 and between two bottom spacers 531.

FIGS. 13A and 13B are demonstrative illustrations of cross-sectional views of a vertical transistor structure in a step of manufacturing thereof, following the step illustrated in FIGS. 12A and 12B, according to one embodiment of present invention. More specifically, embodiments of present invention provide forming additional structural elements of the vertical transistors such as, for example, gate stack 701 surrounding the fins such as the first, second, third, and fourth fins 211, 212, 213, and 222c. A person skilled in the art will appreciate that a horizontal width of the bottom spacer 531 and 532 may be larger than a horizontal width of the gate stack 701 or at least a portion of the gate stack 701 that is immediately adjacent to the bottom spacers 531 and 532, since a horizontal portion of the bottom spacers 531 and 532 are covered by the STI structure 621 during the formation of the gate stack 701. Embodiments of present invention further include forming top spacers 702 next to the gate stacks 701; top S/D regions 811, 812, 813, and 822; top S/D contacts 911, 912, 913, and 922 to contact the top S/D regions; bottom S/D contact 931 to contact the bottom S/D region; and gate contact 932 to contact the gate stacks 701. Embodiments of present invention may additionally include depositing an interlayer dielectric (ILD) 703 covering the above structures of the vertical transistors.

Figure 14:
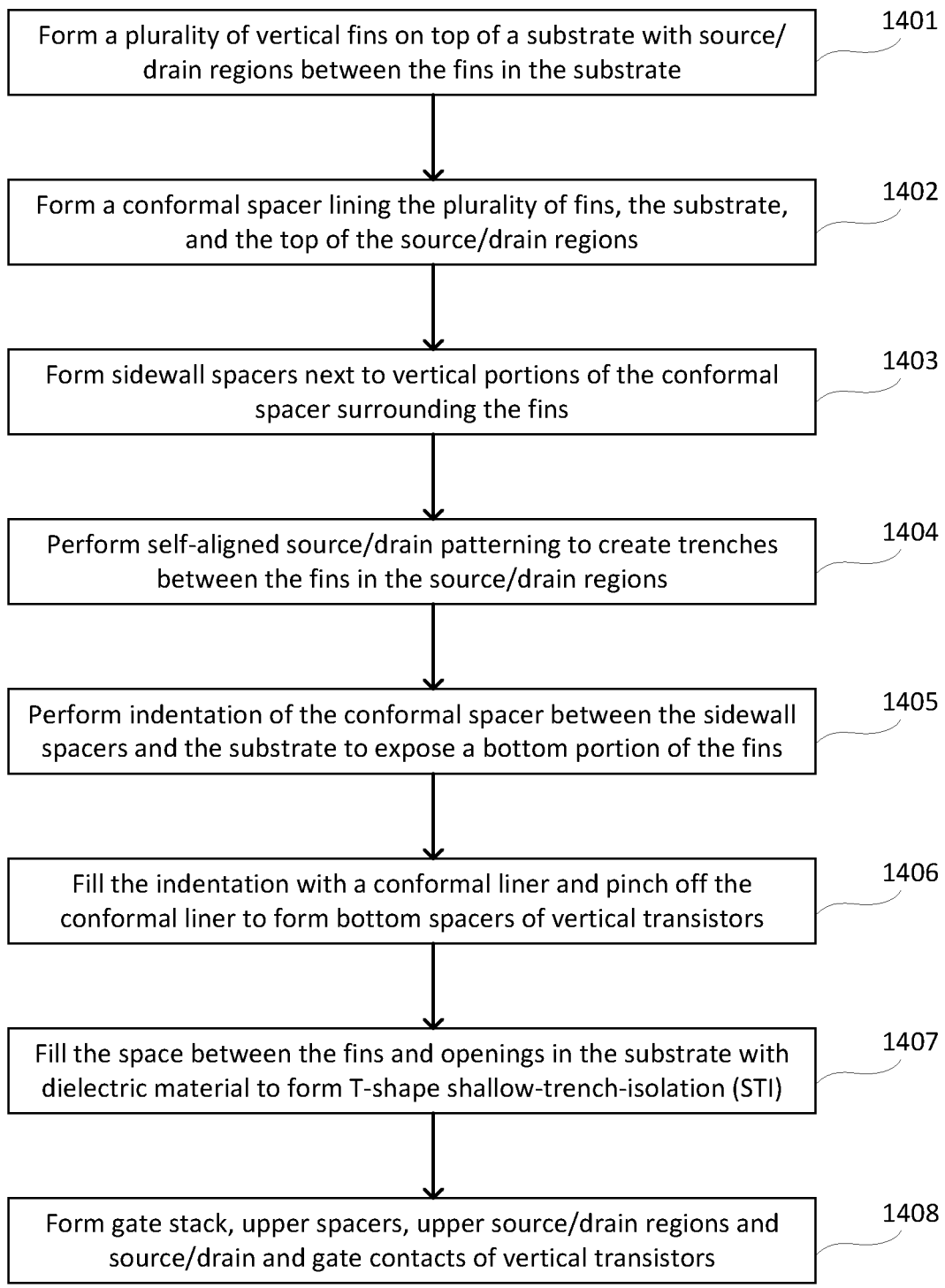
FIG. 14 is a demonstrative illustration of a flow-chart of a method of manufacturing a vertical transistor structure according to embodiments of present invention.

FIG. 14 is a demonstrative illustration of a flow-chart of a method of manufacturing a vertical transistor structure according to embodiments of present invention. The method includes (1401) forming a plurality of vertical fins on top of a substrate with source/drain (S/D) regions between the fins in the substrate; (1402) forming a conformal spacer lining the plurality of vertical fins, the substrate, and the top of the S/D regions; (1403) forming sidewall spacers next to the vertical portions of the conformal spacer that surrounding the fins; (1404) performing a self-aligned S/D patterning process to create trenches between the fins in the S/D regions of the substrate; (1405) performing indentation of the conformal spacer between the sidewalls and the substrate to expose at least a bottom portion of the fins; (1406) filling the openings created by the indentation with a conformal liner and subsequently pinching off the conformal liner inside the openings to form bottom spacers of vertical transistors; (1407) filling the space between the fins and openings in the substrate created during the S/D patterning with dielectric material to form shallow-trench-isolation (STI) structures with a T-shape; and (1408) forming additional structures of the vertical transistor including gate stack, upper spacers, upper S/D regions, and contacts to the upper S/D regions and gate stack.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method of forming a transistor structure comprising:
   forming a set of vertical fins on top of a substrate;
   forming a conformal spacer lining the set of vertical fins and the substrate;
   forming sidewall spacers next to vertical portions of the conformal spacer;
   removing portions of the conformal spacer that are on top of the substrate and between the sidewall spacers;
   indenting the conformal spacer vertically between the sidewall spacers and the substrate to create openings;
   forming bottom spacers in the openings; and
   forming a shallow-trench-isolation (STI) structure between the bottom spacers.

2. The method of claim 1, wherein indenting the conformal spacer comprises performing an isotropic selective etching process to remove portions of the conformal spacer between the sidewall spacers and the substrate to expose a bottom portion of the set of vertical fins.

3. The method of claim 1, wherein forming bottom spacers comprises forming a conformal liner lining the openings and the sidewall spacers, wherein the conformal liner pinches off inside the openings, and subsequently removing the conformal liner on the sidewall spacers through an isotropic etching process.

4. The method of claim 1, further comprising, before forming the STI structure, removing the sidewall spacers to expose horizontal portions of the bottom spacers.

5. The method of claim 4, wherein forming the STI structure comprises forming the STI structure with a T-shape with horizontal portions of the T-shape covering the horizontal portions of the bottom spacers.

6. The method of claim 1, wherein removing portions of the conformal spacer on top of the substrate further comprises removing a portion of an epitaxial source/drain region underneath the conformal spacer.

7. A method of forming a transistor structure, the method comprising:
   forming a first vertical fin, of a first vertical transistor, and a second vertical fin, of a second vertical transistor, on top of a substrate;
   forming a conformal spacer lining the first and second vertical fins and the substrate;
   forming sidewall spacers next to vertical portions of the conformal spacer;
   removing portions of the conformal spacer that are vertically between the sidewall spacers and the substrate to create openings;
   forming bottom spacers in the openings;
   removing the sidewall spacers to expose horizontal portions of the bottom spacers; and
   forming a shallow-trench-isolation (STI) structure between the bottom spacers.

8. The method of claim 7, wherein removing the portions of the conformal spacer comprises performing an isotropic selective etching process, selective to the sidewall spacers, to remove the portions of the conformal spacer between the sidewall spacers and the substrate to expose a bottom portion of the first and second vertical fins.

9. The method of claim 7, wherein forming bottom spacers in the openings comprises forming a conformal liner lining the openings and the sidewall spacers, wherein the conformal liner pinches off inside the openings, and subsequently removing the conformal liner on the sidewall spacers through an isotropic etching process.

10. The method of claim 7, further comprising, before removing the portions of the conformal spacer that are vertically between the sidewall spacers and the substrate, removing a portion of the conformal spacer that are on top of the substrate and horizontally between the sidewall spacers through an anisotropic etching process.

11. The method of claim 10, further comprising, before removing the portions of the conformal spacer that are vertically between the sidewall spacers and the substrate, removing a portion of an epitaxial source/drain (S/D) region underneath the conformal spacer and horizontally between the sidewall spacers, thereby dividing the epitaxial S/D region into a first epitaxial S/D region of the first vertical transistor and a second epitaxial S/D region of the second vertical transistor.

12. The method of claim 11, wherein forming the STI structure comprises forming the STI structure that isolates the first epitaxial S/D region of the first vertical transistor from the second epitaxial S/D region of the second vertical transistor.

13. The method of claim 7, wherein forming the STI structure comprises forming the STI structure with a T-shape wherein horizontal portions of the T-shape cover the horizontal portions of the bottom spacers.

* * * * *